US008890721B2

(12) United States Patent
Chiu

(10) Patent No.: US 8,890,721 B2
(45) Date of Patent: Nov. 18, 2014

(54) KEYBOARD DEVICE WITH LIQUID EXPELLING FUNCTION AND ELECTRONIC MODULE THEREOF

(75) Inventor: Yung-Shan Chiu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 511 days.

(21) Appl. No.: 13/414,719

(22) Filed: Mar. 8, 2012

(65) Prior Publication Data

US 2013/0049996 A1 Feb. 28, 2013

(30) Foreign Application Priority Data

Aug. 24, 2011 (TW) ............................ 100130336 A

(51) Int. Cl.
*H03K 17/94* (2006.01)
*H01H 13/86* (2006.01)

(52) U.S. Cl.
CPC ......... *H01H 13/86* (2013.01); *H01H 2223/004* (2013.01)
USPC .......................................... 341/22; 200/302.1

(58) Field of Classification Search
CPC ............................ H01H 13/063; H01H 9/041
USPC ............................... 341/22; 200/302.1, 302.2
See application file for complete search history.

(56) References Cited

U.S. PATENT DOCUMENTS 5,421,659 A * 6/1995 Liang ............................ 400/472
5,810,491 A * 9/1998 Muller et al. ................. 400/496
6,156,983 A * 12/2000 Chen et al. ................. 200/302.1
6,610,944 B2 * 8/2003 Lee et al. ................... 200/302.1
7,012,206 B2 * 3/2006 Oikawa ....................... 200/302.1
7,385,808 B2 * 6/2008 Hamada et al. .......... 361/679.09
7,535,699 B2 * 5/2009 Hamada et al. .......... 361/679.08
7,990,693 B2 * 8/2011 Nakajima ................ 361/679.09
8,199,491 B2 * 6/2012 Uchiyama et al. ....... 361/679.55
2003/0057076 A1 * 3/2003 Lee et al. ................... 200/302.1
2004/0226248 A1 11/2004 Wu
2005/0224326 A1 * 10/2005 Oikawa ...................... 200/302.1

OTHER PUBLICATIONS

Office action mailed on May 23, 2014 for the China application No. 201110270363.3, p. 3 line 5-34 and line 38-45, p. 4 line 1-42 and p. 5 line 1-22.
Office action mailed on Nov. 12, 2013 for the Taiwan application No. 100130336, filing date: Aug. 24, 2011, p. 1 line 14, p. 2-3, p. 4 line 1-6 and search report.

* cited by examiner

*Primary Examiner* — Jennifer Mehmood
*Assistant Examiner* — Rufus Point
(74) *Attorney, Agent, or Firm* — Winston Hsu; Scott Margo

(57) ABSTRACT

A keyboard device includes a containing casing and a keyboard. At least one engaging hole is formed at the containing casing corresponding to a periphery of a containing opening of the containing casing. The keyboard includes a main body, an engaging ear portion, and a block wall. The main body is contained in the containing opening. The engaging ear portion extends outwardly from the main body and corresponds to the engaging hole. The engaging ear portion is used for engaging with the engaging hole so as to fix the main body in the containing opening. An inverted-trapezoid hole structure is formed on the engaging ear portion. The block wall is formed at an outer edge of the engaging ear portion for preventing liquid from flowing over the engaging ear portion. The liquid flows into the inverted-trapezoid hole structure and then is expelled out of the containing casing.

20 Claims, 6 Drawing Sheets

KEYBOARD DEVICE WITH LIQUID EXPELLING FUNCTION AND ELECTRONIC MODULE THEREOF

BACKGROUND OF THE INVENTION

1. Field of the Invention

The present invention relates to a keyboard device and an electronic module thereof, and more specifically, to a keyboard device with a liquid expelling function and an electronic module thereof.

2. Description of the Prior Art

For a conventional personal computer, a keyboard has become an indispensable device for inputting words, symbols, or numbers. Furthermore, a keyboard is also an essential device for input operations of a conventional consumer electronic product or a large industrial machining apparatus.

However, if a user splashes liquid (e.g. water or drinks) on the keyboard accidentally during use of the keyboard, the liquid may flow into the keyboard. At this time, if the liquid can not be expelled out of the keyboard quickly, short circuit of electronic components (e.g. a membrane) in the keyboard may occur when the liquid contacts the electronic components. Furthermore, the problem that the liquid keeps accumulating in the keyboard may cause more serious damage to the keyboard, so as to influence life of the keyboard.

SUMMARY OF THE INVENTION

Thus, an objective of the present invention is to provide a keyboard device with a liquid expelling function and an electronic module thereof for solving the aforesaid problems.

The present invention provides a keyboard device with a liquid expelling function. The keyboard device includes a containing casing and a keyboard. At least one engaging hole is formed at the containing casing corresponding to a periphery of a containing opening of the containing casing. The keyboard includes a main body, an engaging ear portion, and a block wall. The main body is contained in the containing opening. The engaging ear portion extends outwardly from the main body and corresponds to the engaging hole. The engaging ear portion is used for engaging with the engaging hole so as to fix the main body in the containing opening. An inverted-trapezoid hole structure is formed on the engaging ear portion. The block wall is formed at an outer edge of the engaging ear portion for preventing liquid from flowing over the engaging ear portion. The liquid flows into the inverted-trapezoid hole structure and then is expelled out of the containing casing.

According to the claimed invention, at least one first opening is formed at a short bottom of the inverted-trapezoid hole structure corresponding to the block wall.

According to the claimed invention, at least one second opening is formed at a long bottom of the inverted-trapezoid hole structure.

According to the claimed invention, an inclined guide structure is formed at a side of the main body corresponding to the engaging ear portion and tilts downwardly toward the engaging ear portion for guiding the liquid to flow into the inverted-trapezoid hole structure.

According to the claimed invention, the keyboard device further includes a block pad disposed between the main body and the containing casing and disposed along an edge of the inverted-trapezoid hole structure corresponding to the main body, for preventing the liquid in the inverted-trapezoid hole structure from flowing into a gap between the main body and the containing casing.

According to the claimed invention, the keyboard device further includes a block pad disposed between the main body and the containing casing and disposed along an edge of the inverted-trapezoid hole structure corresponding to the main body, for preventing the liquid in the inverted-trapezoid hole structure from flowing into a gap between the main body and the containing casing.

The present invention further provides an electronic module with a liquid expelling function. The electronic module includes an electronic device and a keyboard device. The keyboard device is installed on the electronic device. The keyboard device includes a containing casing and a keyboard. At least one engaging hole is formed at the containing casing corresponding to a periphery of a containing opening of the containing casing. The keyboard includes a main body, an engaging ear portion, and a block wall. The main body is contained in the containing opening. The engaging ear portion extends outwardly from the main body and corresponds to the engaging hole. The engaging ear portion is used for engaging with the engaging hole so as to fix the main body in the containing opening. An inverted-trapezoid hole structure is formed on the engaging ear portion. The block wall is formed at an outer edge of the engaging ear portion for preventing liquid from flowing over the engaging ear portion. The liquid flows into the inverted-trapezoid hole structure and then is expelled out of the electronic device via the containing casing.

According to the claimed invention, the keyboard device is installed on the electronic device in a relatively-inclined manner for guiding the liquid to flow into the inverted-trapezoid hole structure.

In summary, the present invention utilizes the design that the inverted-trapezoid hole structure is formed on the engaging ear portion for fixing the keyboard and the containing casing, to achieve the purpose that liquid splashed on the keyboard can be guided to flow into the inverted-trapezoid hole structure and then expelled out of the containing casing or the electronic device. In such a manner, the present invention can avoid short circuit of the electronic components in the electronic device or the keyboard device caused by the liquid which flows into the keyboard device. Furthermore, the present invention can also solve the problem that the liquid may keep accumulating in the keyboard device, so as to prevent the keyboard device from more serious damage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
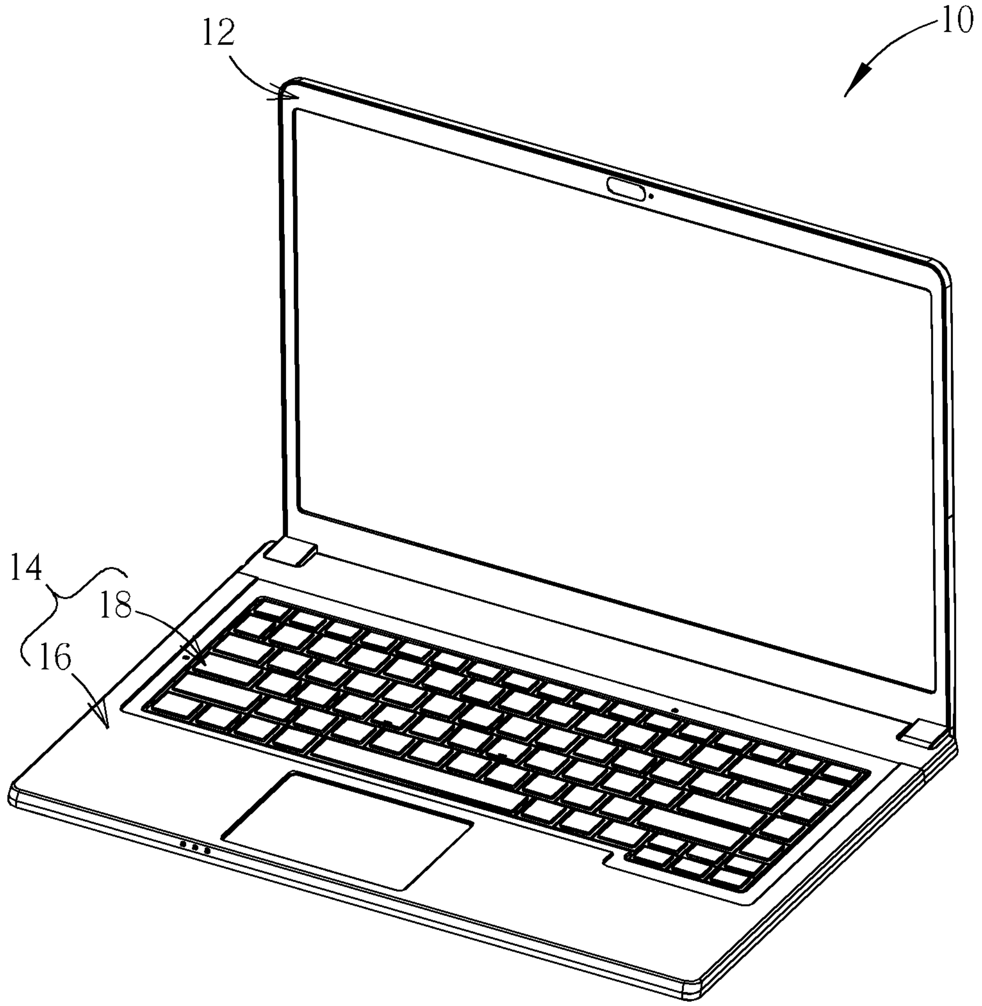
FIG. 1 is a diagram of an electronic module according to an embodiment of the present invention.

Please refer to FIG. 1, which is a diagram of an electronic module 10 according to an embodiment of the present invention. As shown in FIG. 1, the electronic module 10 includes an electronic device 12 and a keyboard device 14. The electronic device 12 can be a common electronic apparatus which needs an input device for performing its operations, such as a portable electronic device (e.g. a notebook) having a foldable mechanism with an upper cover and a lower casing. The keyboard device 14 is installed on the electronic device 12. The keyboard device 14 includes a containing casing 16 and a keyboard 18.

Figure 2:
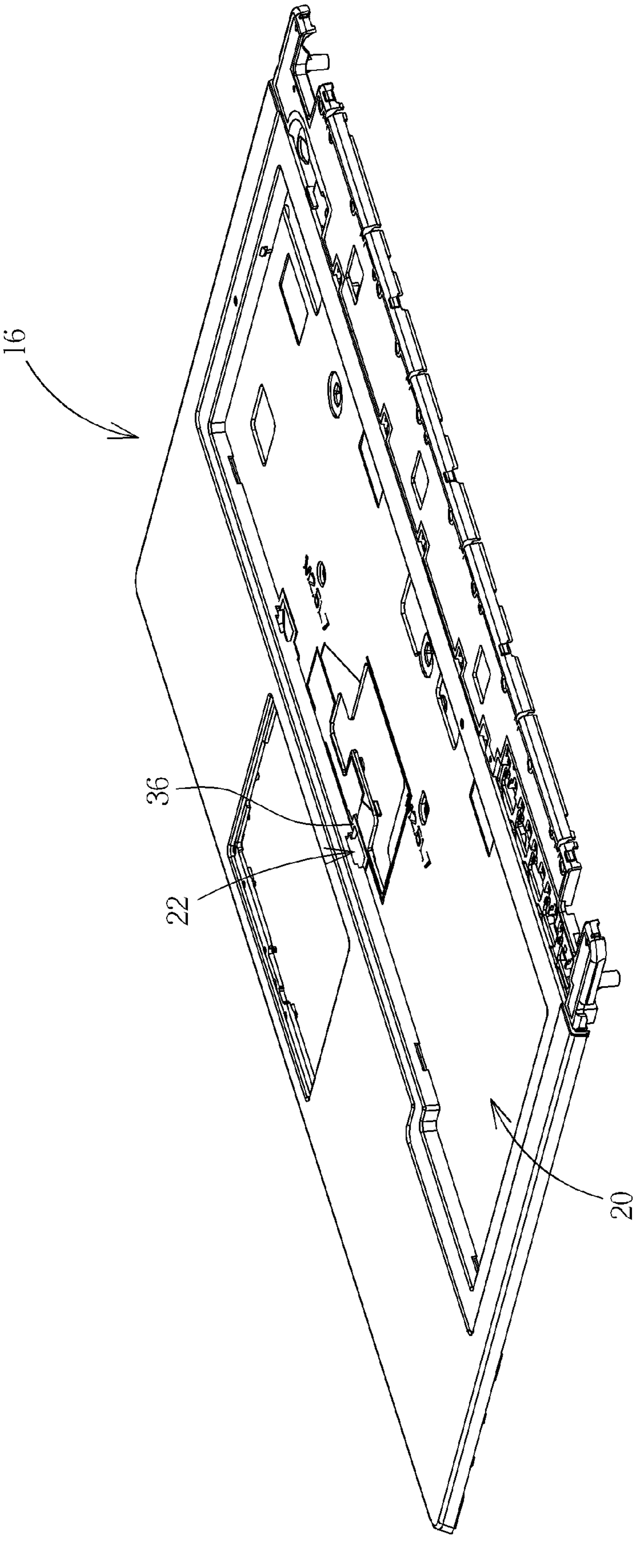
FIG. 2 is a diagram of a containing casing in FIG. 1 at another viewing angle.
Figure 3:
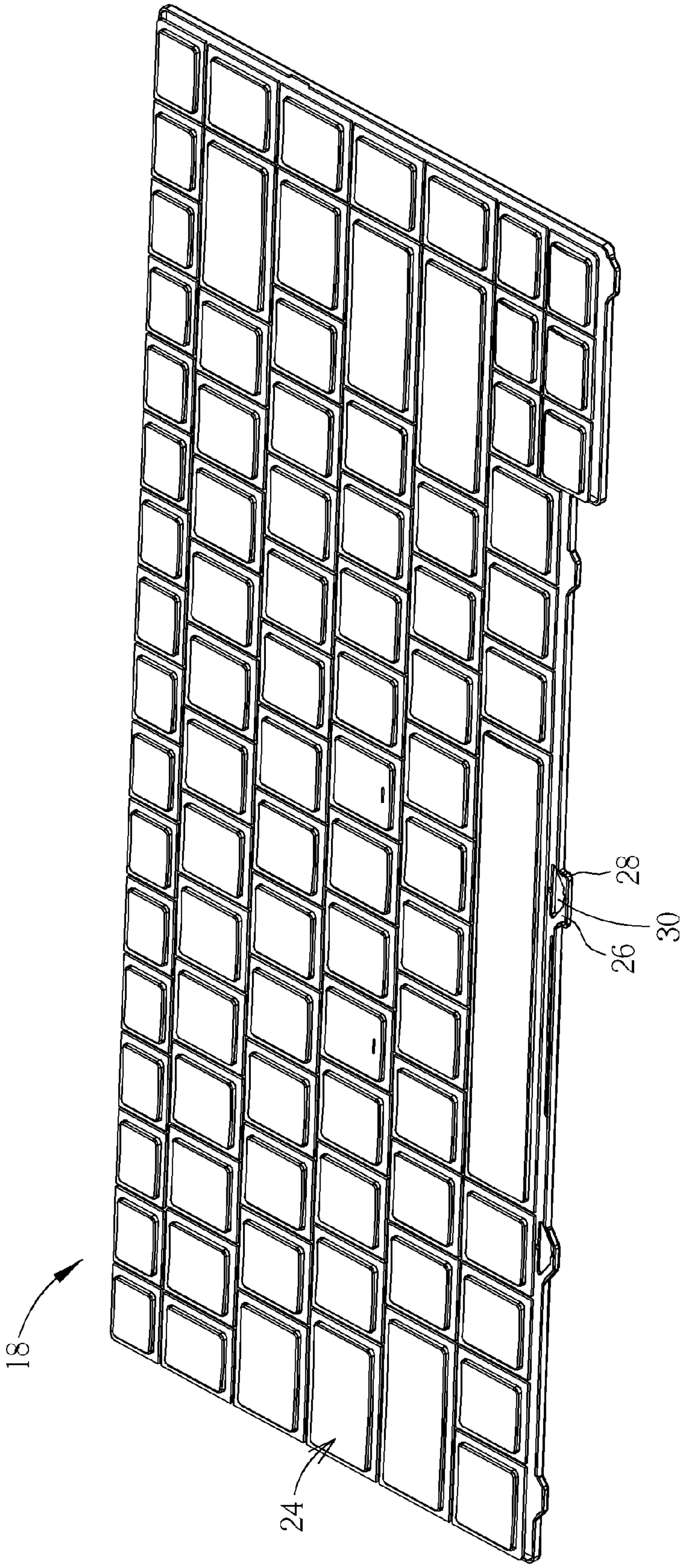
FIG. 3 is a diagram of a keyboard in FIG. 1.

More detailed description for the structural designs of the containing casing 16 and keyboard 18 is provided as follows. Please refer to FIG. 2 and FIG. 3. FIG. 2 is a diagram of the containing casing 16 in FIG. 1 at another viewing angle. FIG. 3 is a diagram of the keyboard 18 in FIG. 1. As shown in FIG. 2 and FIG. 3, the containing casing 16 has a containing opening 20 and at least one engaging hole 22 (five shown in FIG. 2) formed thereon corresponding to a periphery of the containing opening 20. The keyboard 18 is disposed on the containing casing 16. The keyboard 18 includes a main body 24, at least one engaging ear portion 26 (five shown in FIG. 3), and a block wall 28. The main body 24 is contained in the containing opening 20. In this embodiment, the main body 24 includes main components commonly applied to a conventional keyboard, such as a keyswitch and a membrane, and the related description is omitted herein since it is commonly seen in the prior art.

Figure 4:
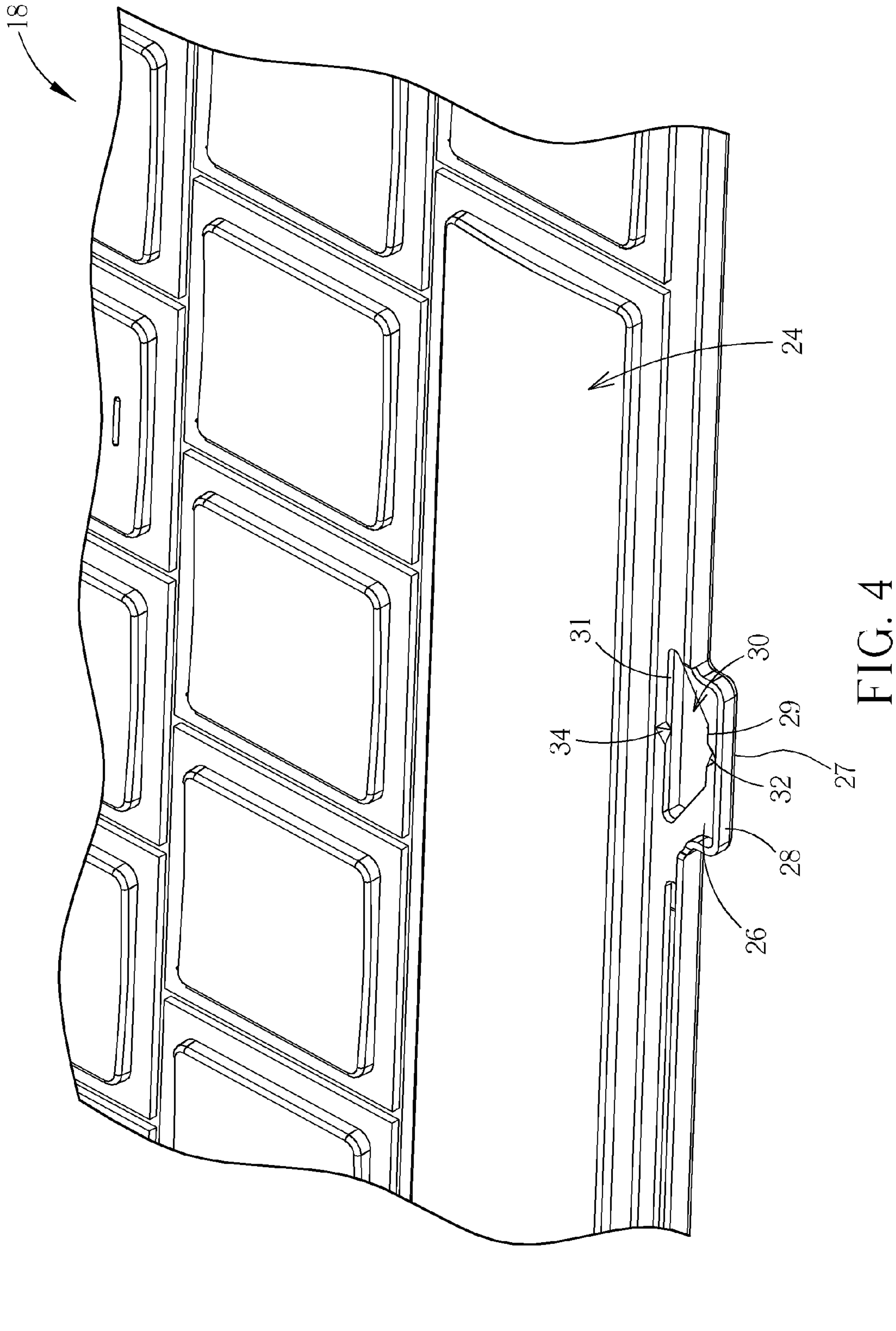
FIG. 4 is a partial enlarged diagram of the keyboard in FIG. 3.

The design that an engaging ear portion is utilized to expel liquid out of the electronic device 12 can be applied to at least one of the plurality of engaging ear portions 26, and number of the engaging ear portion 26 with a liquid expelling function depends on the practical application of the electronic module 10. In the following, only one of the engaging ear portion 26 with the liquid expelling function is described in details for simplicity. As for other engaging ear portion 26 with the liquid expelling function, its structural design can be reasoned by analogy. Please refer to FIG. 2, FIG. 3, and FIG. 4. FIG. 4 is a partial enlarged diagram of the keyboard 18 in FIG. 3. The engaging ear portion 26 extends outwardly from the main body 24 and corresponds to the engaging hole 22. The engaging ear portion 26 is used for engaging with the engaging hole 22 so as to fix the main body 24 in the containing opening 20. An inverted-trapezoid hole structure 30 is formed on the engaging ear portion 26. For guiding liquid to flow into the inverted-trapezoid hole structure 30 more efficiently, in this embodiment, at least one first opening 32 (one shown in FIG. 4) is formed at a short bottom 29 of the inverted-trapezoid hole structure 30 corresponding to the block wall 28, and at least one second opening 34 (one shown in FIG. 4) is formed at a long bottom 31 of the inverted-trapezoid hole structure 30. Accordingly, when liquid flows to the short bottom 29 or the long bottom 31, the surface tension of the liquid can be broken via the first opening 32 or the second opening 34 so as to make the liquid flow into the inverted-trapezoid hole structure 30 more easily. To be noted, the structural designs of the said openings are not limited to the said embodiment, meaning that numbers and configurations of the said openings depend on the practical application of the keyboard device 14. For example, the short bottom 29 of the inverted-trapezoid hole structure 30 corresponding to the block wall 28 can have plural first openings 32 formed thereon instead, and the first openings 32 can be formed as a continuous tooth structure cooperatively.

Figure 5:
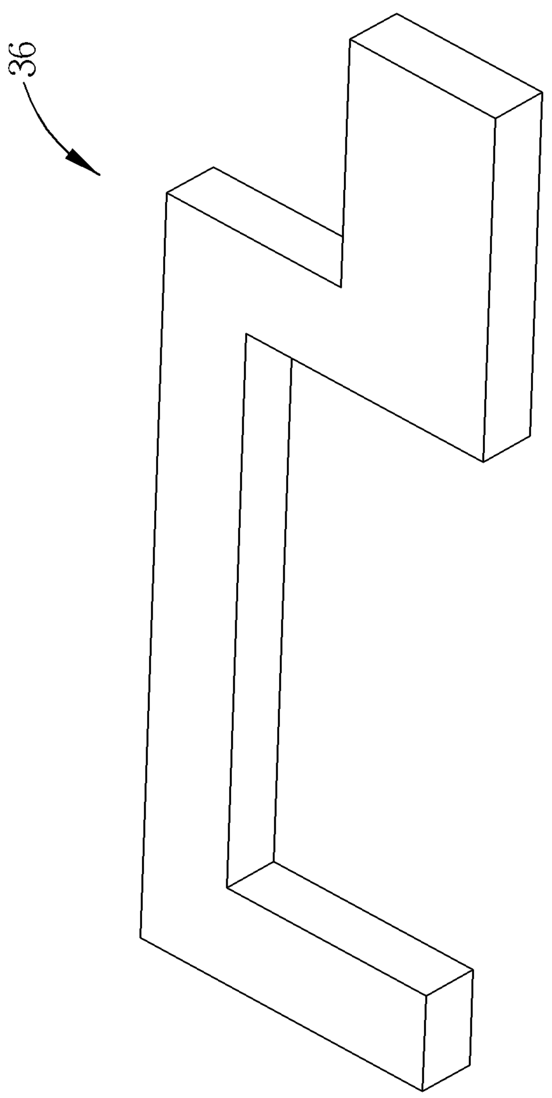
FIG. 5 is an enlarged diagram of a block pad in FIG. 2.
Figure 6:
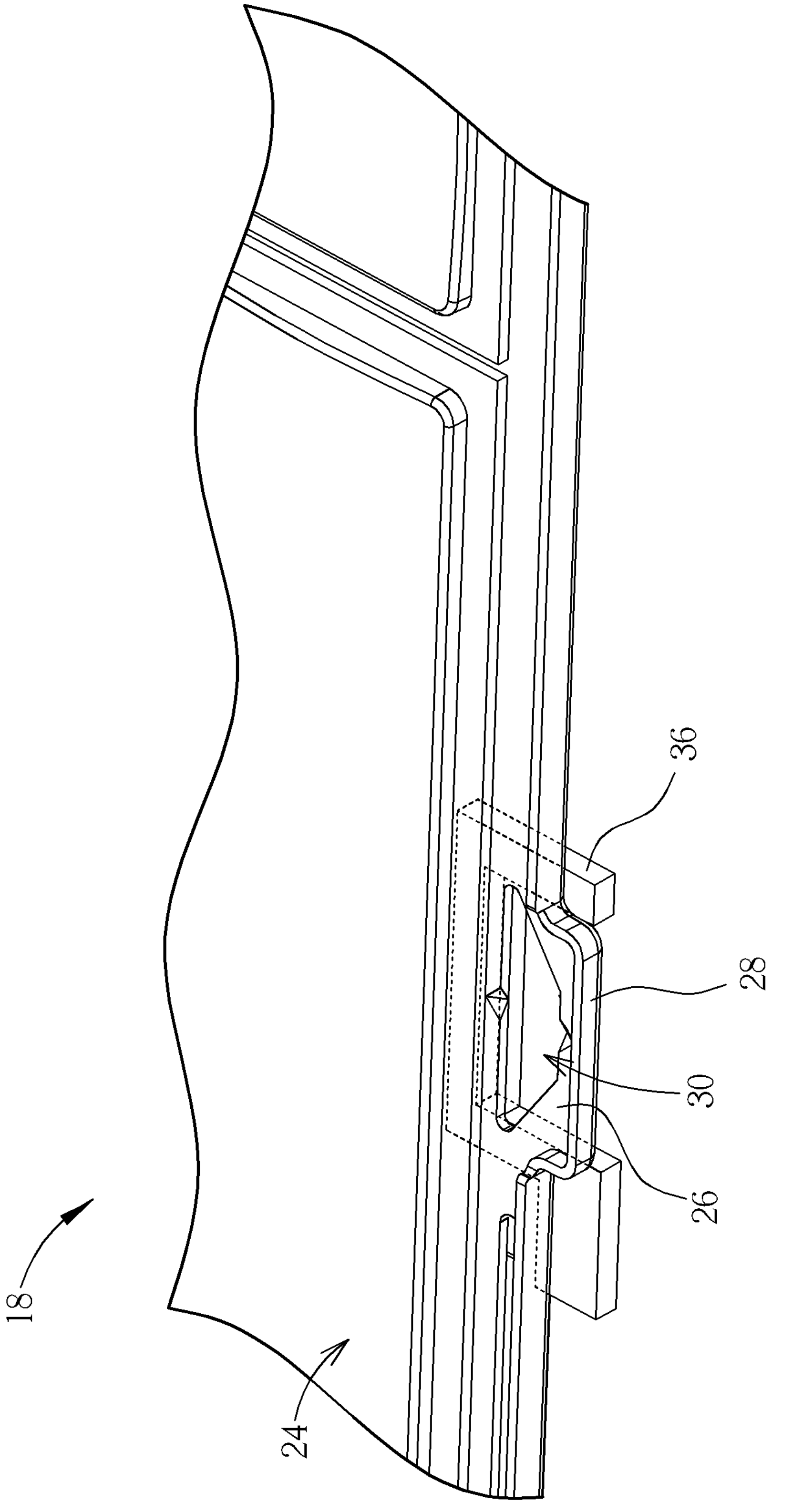
FIG. 6 is a diagram of the block pad in FIG. 5 being disposed along an edge of an inverted-trapezoid hole structure corresponding to a main body.

The block wall 28 is formed at an outer edge 27 of the engaging ear portion 26 for preventing liquid from flowing over the engaging ear portion 26, so that the liquid can flow back to the inverted-trapezoid hole structure 30. As a result, the purpose that liquid can flow into the inverted-trapezoid hole structure 30 more efficiently can be achieved. In practical application, for further preventing liquid from flowing into a gap between the main body 24 and the containing casing 16, the keyboard device 14 can further include a block pad 36. In this embodiment, the block pad 36 is made of rubber material, but is not limited thereto. The related design can be as shown in FIG. 2, FIG. 5, and FIG. 6. FIG. 5 is an enlarged diagram of the block pad 36 in FIG. 2. FIG. 6 is a diagram of the block pad 36 in FIG. 5 being disposed along an edge of the inverted-trapezoid hole structure 30 corresponding to the main body 24. As shown in FIG. 2, FIG. 5 and FIG. 6, the block pad 36 is disposed between the main body 24 and the containing casing 16 and is disposed along the edge of the inverted-trapezoid hole structure 30 corresponding to the main body 24. The block pad 36 is used for blocking liquid not to flow into the gap between the main body 24 and the containing casing 16, so as to prevent the liquid from contacting the electronic components (e.g. a motherboard) in the electronic device 12 or the keyboard device 14. Thus, short circuit of the electronic module 10 can be avoided efficiently.

In the said configuration, if a user splashes liquid (e.g. water or drinks) on the keyboard device 14 accidentally during use of the electronic module 10, the liquid flows into the engaging ear portion 26 via gaps of keyswitches on the keyboard 18, and then flows into the inverted-trapezoid hole structure 30 via guidance of the first opening 32, the second opening 34 and the block wall 28. Finally, the liquid gathering in the inverted-trapezoid hole structure 30 can be expelled out of the electronic device 12 via the containing casing 16. To be brief, via disposal of the first opening 32, the second opening 34, the block wall 28 and the inverted-trapezoid hole structure 30 on the engaging ear portion 26, the liquid splashed on the keyboard device 14 can be expelled out of the electronic device 12 quickly. In such a manner, the electronic module 10 can avoid short circuit of the electronic components in the electronic device 12 or the keyboard device 14 caused by the liquid which flows into the keyboard device 14. Furthermore, the electronic module 10 can also solve the problem that the liquid may keep accumulating in the keyboard device 14, so as to prevent the electronic device 12 and the keyboard device 14 from more serious damage.

As for how to expel liquid gathering in the inverted-trapezoid hole structure 30 out of the electronic device 12 via the containing casing 16, the related liquid expelling design applied to the keyboard device 14 and the electronic device 12 is commonly seen in the prior art. For example, a liquid expelling hole can be formed on the electronic device 12 and the containing casing 16 respectively corresponding to the inverted-trapezoid hole structure 30. Each liquid expelling hole is communicated with the inverted-trapezoid hole structure 30. In such a manner, the liquid in the inverted-trapezoid hole structure 30 can pass through the liquid expelling hole on the containing casing 16 and the liquid expelling hole on the electronic device 12 sequentially and then is expelled out of the electronic device 12. In another example, a liquid guide channel can be formed on the containing casing 16 corresponding to the inverted-trapezoid hole structure 30, and a liquid expelling hole is formed on a bottom or a side of the electronic device 12 to be communicated with the liquid guide channel. In such a manner, the liquid in the inverted-trapezoid hole structure 30 can flow to the liquid expelling hole on the electronic device 12 via the liquid guide channel on the containing casing 16, and then is expelled out of the bottom or the side of the electronic device 12.

To be noted, for guiding liquid splashed on the keyboard device 14 to flow to engaging ear portion 26 more efficiently, the keyboard device 14 can be installed on the electronic device 12 in a relatively-inclined manner. Furthermore, an inclined guide structure (not shown in figures) can be additionally formed on a side of the main body 24 corresponding to the engaging ear portion 26 and extend downwardly toward the engaging ear portion 26 from the edge of the main body 24. Accordingly, liquid which flows to the edge of the main body 24 can be guided to the engaging ear portion 26 by the inclined guide structure, so as to improve the liquid guide efficiency of the keyboard device 14.

It should be mentioned that the keyboard device 14 can also be an independent keyboard apparatus without assembling with other components. As for which design is utilized, it depends on the practical application of the keyboard device 14.

Compared with the prior art, the present invention utilizes the design that the inverted-trapezoid hole structure is formed on the engaging ear portion for fixing the keyboard and the containing casing, to achieve the purpose that liquid splashed on the keyboard can be guided to flow into the inverted-trapezoid hole structure and then expelled out of the containing casing or the electronic device. In such a manner, the present invention can avoid short circuit of the electronic components in the electronic device or the keyboard device caused by the liquid which flows into the keyboard device. Furthermore, the present invention can also solve the problem that the liquid may keep accumulating in the keyboard device, so as to prevent the keyboard device from more serious damage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A keyboard device with a liquid expelling function, the keyboard device comprising:
- a containing casing having a containing opening and at least one engaging hole formed thereon corresponding to a periphery of the containing opening; and
- a keyboard disposed on the containing casing, the keyboard comprising:
  - a main body contained in the containing opening;
  - an engaging ear portion extending outwardly from the main body and corresponding to the engaging hole, for engaging with the engaging hole so as to fix the main body in the containing opening, an inverted-trapezoid hole structure being formed on the engaging ear portion; and
  - a block wall formed at an outer edge of the engaging ear portion, for preventing liquid from flowing over the engaging ear portion;
- wherein the liquid flows into the inverted-trapezoid hole structure and then is expelled out of the containing casing.

2. The keyboard device of claim 1, wherein at least one first opening is formed at a short bottom of the inverted-trapezoid hole structure corresponding to the block wall.

3. The keyboard device of claim 2, wherein at least one second opening is formed at a long bottom of the inverted-trapezoid hole structure.

4. The keyboard device of claim 3, wherein an inclined guide structure is formed at a side of the main body corresponding to the engaging ear portion and tilts downwardly toward the engaging ear portion for guiding the liquid to flow into the inverted-trapezoid hole structure.

5. The keyboard device of claim 4, further comprising:
- a block pad disposed between the main body and the containing casing and disposed along an edge of the inverted-trapezoid hole structure corresponding to the main body, for preventing the liquid in the inverted-trapezoid hole structure from flowing into a gap between the main body and the containing casing.

6. The keyboard device of claim 3, further comprising:
- a block pad disposed between the main body and the containing casing and disposed along an edge of the inverted-trapezoid hole structure corresponding to the main body, for preventing the liquid in the inverted-trapezoid hole structure from flowing into a gap between the main body and the containing casing.

7. The keyboard device of claim 2, wherein an inclined guide structure is formed at a side of the main body corresponding to the engaging ear portion and tilts downwardly toward the engaging ear portion for guiding the liquid to flow into the inverted-trapezoid hole structure.

8. The keyboard device of claim 2, further comprising:
- a block pad disposed between the main body and the containing casing and disposed along an edge of the inverted-trapezoid hole structure corresponding to the main body, for preventing the liquid in the inverted-trapezoid hole structure from flowing into a gap between the main body and the containing casing.

9. The keyboard device of claim 1, wherein an inclined guide structure is formed at a side of the main body corresponding to the engaging ear portion and tilts downwardly toward the engaging ear portion for guiding the liquid to flow into the inverted-trapezoid hole structure.

10. The keyboard device of claim 1, further comprising:
- a block pad disposed between the main body and the containing casing and disposed along an edge of the inverted-trapezoid hole structure corresponding to the main body, for preventing the liquid in the inverted-trapezoid hole structure from flowing into a gap between the main body and the containing casing.

11. An electronic module with a liquid expelling function, the electronic module comprising:
- an electronic device; and
- a keyboard device installed on the electronic device, the keyboard device comprising:
  - a containing casing having a containing opening and at least one engaging hole formed thereon corresponding to a periphery of the containing opening; and
  - a keyboard disposed on the containing casing, the keyboard comprising:
    - a main body contained in the containing opening;
    - an engaging ear portion extending outwardly from the main body and corresponding to the engaging hole, for engaging with the engaging hole so as to fix the main body in the containing opening, an inverted-trapezoid hole structure being formed on the engaging ear portion; and
    - a block wall formed at an outer edge of the engaging ear portion, for preventing liquid from flowing over the engaging ear portion;
- wherein the liquid flows into the inverted-trapezoid hole structure and then is expelled out of the electronic device via the containing casing.

12. The electronic module of claim 11, wherein at least one first opening is formed at a short bottom of the inverted-trapezoid hole structure corresponding to the block wall.

13. The electronic module of claim 12, wherein at least one second opening is formed at a long bottom of the inverted-trapezoid hole structure.

14. The electronic module of claim 13, wherein an inclined guide structure is formed at a side of the main body corresponding to the engaging ear portion and tilts downwardly toward the engaging ear portion for guiding the liquid to flow into the inverted-trapezoid hole structure.

15. The electronic module of claim 14, wherein the keyboard device further comprises:

a block pad disposed between the main body and the containing casing and disposed along an edge of the inverted-trapezoid hole structure corresponding to the main body, for preventing the liquid in the inverted-trapezoid hole structure from flowing into a gap between the main body and the containing casing.

16. The electronic module of claim 13, wherein the keyboard device further comprises:

a block pad disposed between the main body and the containing casing and disposed along an edge of the inverted-trapezoid hole structure corresponding to the main body, for preventing the liquid in the inverted-trapezoid hole structure from flowing into a gap between the main body and the containing casing.

17. The electronic module of claim 13, wherein the keyboard device is installed on the electronic device in a relatively-inclined manner for guiding the liquid to flow into the inverted-trapezoid hole structure.

18. The electronic module of claim 11, wherein an inclined guide structure is formed at a side of the main body corresponding to the engaging ear portion and tilts downwardly toward the engaging ear portion for guiding the liquid to flow into the inverted-trapezoid hole structure.

19. The electronic module of claim 11, wherein the keyboard device further comprises:

a block pad disposed between the main body and the containing casing and disposed along an edge of the inverted-trapezoid hole structure corresponding to the main body, for preventing the liquid in the inverted-trapezoid hole structure from flowing into a gap between the main body and the containing casing.

20. The electronic module of claim 11, wherein the keyboard device is installed on the electronic device in a relatively-inclined manner for guiding the liquid to flow into the inverted-trapezoid hole structure.

* * * * *